US008515982B1

(12) United States Patent
Hickman et al.

(10) Patent No.: US 8,515,982 B1
(45) Date of Patent: Aug. 20, 2013

(54) ANNOTATIONS FOR THREE-DIMENSIONAL (3D) OBJECT DATA MODELS

(71) Applicants: Ryan Hickman, Mountain View, CA (US); James J. Kuffner, Jr., Mountain View, CA (US); Anthony Gerald Francis, Jr., San Jose, CA (US); Arshan Poursohi, Berkeley, CA (US); James R. Bruce, Sunnyvale, CA (US); Thor Lewis, San Francisco, CA (US); Chaitanya Gharpure, Sunnyvale, CA (US)

(72) Inventors: Ryan Hickman, Mountain View, CA (US); James J. Kuffner, Jr., Mountain View, CA (US); Anthony Gerald Francis, Jr., San Jose, CA (US); Arshan Poursohi, Berkeley, CA (US); James R. Bruce, Sunnyvale, CA (US); Thor Lewis, San Francisco, CA (US); Chaitanya Gharpure, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/644,362

(22) Filed: Oct. 4, 2012

Related U.S. Application Data

(60) Provisional application No. 61/558,894, filed on Nov. 11, 2011.

(51) Int. Cl.
  *G06F 17/30* (2006.01)
(52) U.S. Cl.
  USPC .............. 707/758; 707/780; 707/E17.041
(58) Field of Classification Search
  None
  See application file for complete search history.

(56) References Cited

U.S. PATENT DOCUMENTS

| 7,760,201 B2 | 7/2010 | Couture-Gagnon |
| 8,040,355 B2 | 10/2011 | Burley et al. |
| 2010/0238166 A1 | 9/2010 | Tamstorf et al. |

OTHER PUBLICATIONS

Attene et al. (Characterization of 3D shape parts for semantic annotation, Computer-Aided Design 41 (2009) 756-763), hereinafter "Attene").*
Autodesk 123D Catch, Catch and carry, Turn ordinary photos into extraordinary 3D models, www.123dapp.com/catch, 2013.
Memoli, Facundo, "On the use of Gromov-Hausdorff Distances for Shape Comparison", Eurographics Symposium on Point-Based Graphics, 2007.
Memoli, Facundo, "Spectral Gromov-Wasserstein Distances for Shape Matching", NORDIA-ICCV-2009.
Kim, Vladimir G. et al., "Blended Intrinsic Maps", ACM Transactions on Graphics, Jul. 2011.
Kim, Vladimir G. et al., "Exploring Collections of 3D Models using Fuzzy Correspondences", Transactions on Graphics, Aug. 2012.
Kaick, Oliver Van et al., "A Survey on Shape Correspondence", Computer Graphics Forum, vol. 30, Issue 6, pp. 1681-1707, Sep. 2011.
Lipman, Yaron et al., "Mobius Voting for Surface Correspondence", ACM Transactions on Graphics, Aug. 2009.

\* cited by examiner

*Primary Examiner* — Anteneh Girma
(74) *Attorney, Agent, or Firm* — McDonnell Boehnen Hulbert & Berghoff LLP

(57) ABSTRACT

Methods and systems for interacting with multiple three-dimensional (3D) object data models are provided. An example method may involve receiving an annotated template of a first three-dimensional (3D) object data model. The annotated template may be associated with a given category of objects and may include one or more annotations to one or more aspects of an object described by the first 3D object data model. The method may also include determining matching correspondences between the first 3D object data model and a second 3D object data model that is a given object in the given category. For the one or more matching correspondences, an annotation that is associated with a correspondence point of the first 3D object data model may be applied as a call-out to a matching correspondence point of the second 3D object data model.

24 Claims, 11 Drawing Sheets

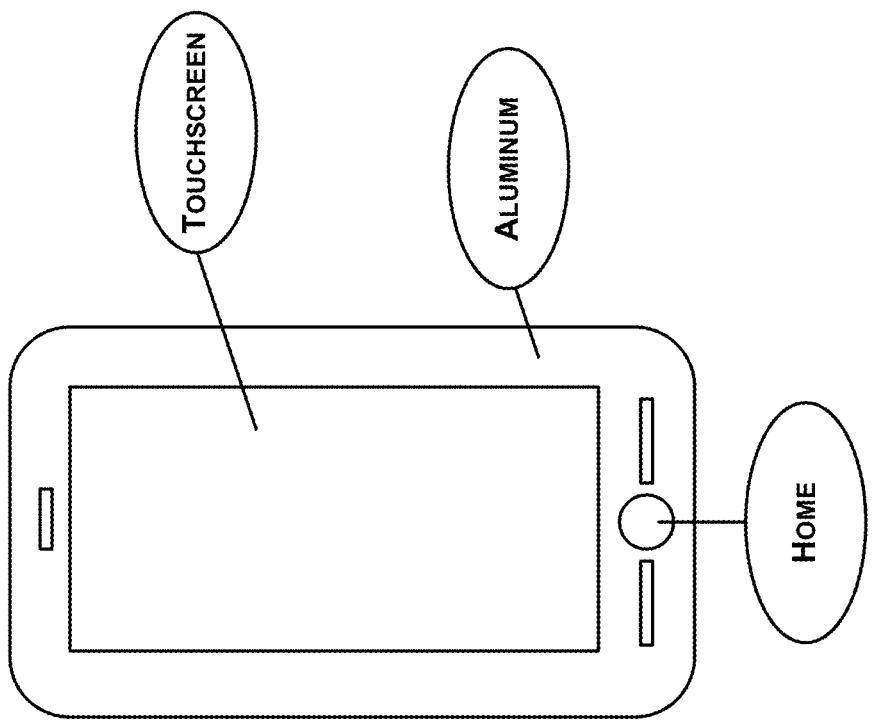

Computer Program Product 900

Signal Bearing Medium 901

Program Instructions 902

- receiving an annotated template of a first three-dimensional (3D) object data model, the annotated template associated with a given category of objects, wherein the annotated template includes one or more annotations to one or more aspects of an object described by the first 3D object data model that indicate information associated with attributes of the one or more aspects of the object;

- determining one or more matching correspondences between the first 3D object data model and a second 3D object data model, wherein the second 3D object data model describes a given object in the given category; and

- for the one or more matching correspondences between the first 3D object data model and the second 3D object data model, applying an annotation that is associated with a correspondence point of the first 3D object data model as a call-out to a matching correspondence point of the second 3D object data model.

| Computer Readable Medium 903 | Computer Recordable Medium 904 | Communications Medium 905 |

FIGURE 9

ANNOTATIONS FOR THREE-DIMENSIONAL (3D) OBJECT DATA MODELS

CROSS-REFERENCE TO RELATED APPLICATIONS

This application claims the benefit of U.S. Provisional Application No. 61/558,894 filed on Nov. 11, 2011, the entirety of which is herein incorporated by reference.

BACKGROUND

In computer graphics, three-dimensional (3D) modeling involves generation of a representation of a 3D surface of an object. The representation may be referred to as a 3D object data model, and can be rendered or displayed as a two-dimensional image via 3D rendering or displayed as a three-dimensional image. 3D object data models represent a 3D object using a collection of points in 3D space, connected by various geometric entities such as triangles, lines, curved surfaces, etc. Various techniques exist for generating 3D object data models utilizing point clouds and geometric shapes, for examples.

Being a collection of data, 3D models can be created by hand, algorithmically, or by scanning objects, for example. As an example, an artist may manually generate a 3D image of an object that can be used as the 3D model. As another example, a given object may be scanned from a number of different angles, and the scanned images can be combined to generate the 3D image of the object. As still another example, an image of an object may be used to generate a point cloud that can be algorithmically processed to generate the 3D image.

3D object data models may include solid models that define a volume of the object, or may include shell or boundary models that represent a surface (e.g. the boundary) of the object. Because an appearance of an object depends largely on an exterior of the object, boundary representations are common in computer graphics.

3D models are used in a wide variety of fields, and may be displayed using a number of different types of interfaces. Example interfaces may provide functionality to enable interaction between a user and the 3D models.

SUMMARY

In one example aspect, a method is provided that involves receiving an annotated template of a first three-dimensional (3D) object data model. The annotated template may be associated with a given category of objects and may include one or more annotations to one or more aspects of an object described by the first 3D object data model. The one or more annotations may indicate information associated with attributes of the one or more aspects of the object. The method may also include determining one or more matching correspondences between the first 3D object data model and a second 3D object data model. The second 3D object data model may describe a given object in the given category. According to the method, for the one or more matching correspondences between the first 3D object data model and the second 3D object data model, an annotation that is associated with a correspondence point of the first 3D object data model may be applied as a call-out to a matching correspondence point of the second 3D object data model.

In another example aspect, a computer-readable medium having stored therein instructions, that when executed by a computing device, cause the computing device to perform functions is provided. The functions may involve receiving an annotated template of a first three-dimensional (3D) object data model. The annotated template may be associated with a given category of objects and may include one or more annotations to one or more aspects of an object described by the first 3D object data model. The one or more annotations may indicate information associated with attributes of the one or more aspects of the object. The functions may also include determining one or more matching correspondences between the first 3D object data model and a second 3D object data model. The second 3D object data model may describe a given object in the given category. According to the functions, for the one or more matching correspondences between the first 3D object data model and the second 3D object data model, an annotation that is associated with a correspondence point of the first 3D object data model may be applied as a call-out to a matching correspondence point of the second 3D object data model.

In still another example aspect, a system is provided that involves a database, a matching component coupled to the database, and an annotation component coupled to the matching component. The database may include an annotated template of a first three-dimensional (3D) object data model. The annotated template may be associated with a given category of objects and may include one or more annotations to one or more aspects of an objects described by the first 3D object data model. The one or more annotations may indicate information associated with attributes of the one or more aspects of the object. The matching component may be configured to determine one or more matching correspondences between the first 3D object data model and a second 3D object data model. The second 3D object data model may describe a given object in the given category. The annotation component may be configured to apply an annotation that is associated with a correspondence point of the first 3D object data model as a call-out to a matching correspondence point of the second 3D object data model for the one or more matching correspondences between the first 3D object data model and the second 3D object data model.

In yet another example aspect, a method is provided that involves receiving information associated with click-rates for call-outs of a three-dimensional (3D) object data model. The click-rates may be determined based on frequencies with which given call-outs are selected while the 3D object data model is rendered on a display. The call-outs may include annotations that are associated with one or more aspects of an object described by the 3D object data model. Additionally, the method may include determining a modification to the call-outs for the 3D object data model based on the information associated with click-rates for the call-outs. According to the method, modified call-outs for the 3D object data model may be provided. The modified call-outs for the 3D object data model may facilitate display of the call-outs of the 3D object data model during a subsequent display of the 3D object data model.

The foregoing summary is illustrative only and is not intended to be in any way limiting. In addition to the illustrative aspects, embodiments, and features described above, further aspects, embodiments, and features will become apparent by reference to the figures and the following detailed description.

BRIEF DESCRIPTION OF THE FIGURES

FIGS. 4A-4C conceptually illustrate examples of applying an annotated template of a three-dimensional (3D) object data model to a given 3D object data model.

FIG. 9 is a schematic illustrating a conceptual partial view of an example computer program product that includes a computer program for executing a computer process on a computing device, arranged according to at least some embodiments presented herein.

DETAILED DESCRIPTION

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

This disclosure may disclose, inter alia, methods and systems for applying annotations for three-dimensional (3D) object data models. An annotated template of an object in a given category can be generated or received and applied to other 3D object data models that represent objects in the given category. For instance, annotations from the template may be applied based on matching correspondences between a 3D object data model of the annotated template and other 3D object data models. In one example, matching correspondences between the 3D object data model for the annotated template and given 3D object data models of other objects in a category may be determined based on any combination of geometric properties (e.g., surface or volume properties) and material properties.

In some instances, the annotation may be applied as a call-out that is associated with an aspect of an object (e.g., to provide labels for aspects of an object). Optionally, the call-out may be or include advertisement information associated with an aspect. The annotated template may be used to identify points of corresponding aspects in other 3D object data models of the category for placement of call-outs. As an example, an annotated template of a coat or jacket may be determined and used to automatically identify positions of common aspects such as a collar, right cuff, button/zipper, hood, etc. in any 3D object data model of a coat or jacket. Call-outs (e.g., custom or default call-outs) for the common aspects may then be associated with the 3D object data models of the category at the identified positions. Thus, given an annotated template for a given category, determined matching correspondences between the template and 3D objects data models of the category may be used to identify common attributes and facilitate automatic labeling of annotations for the 3D object data models.

Figure 1:
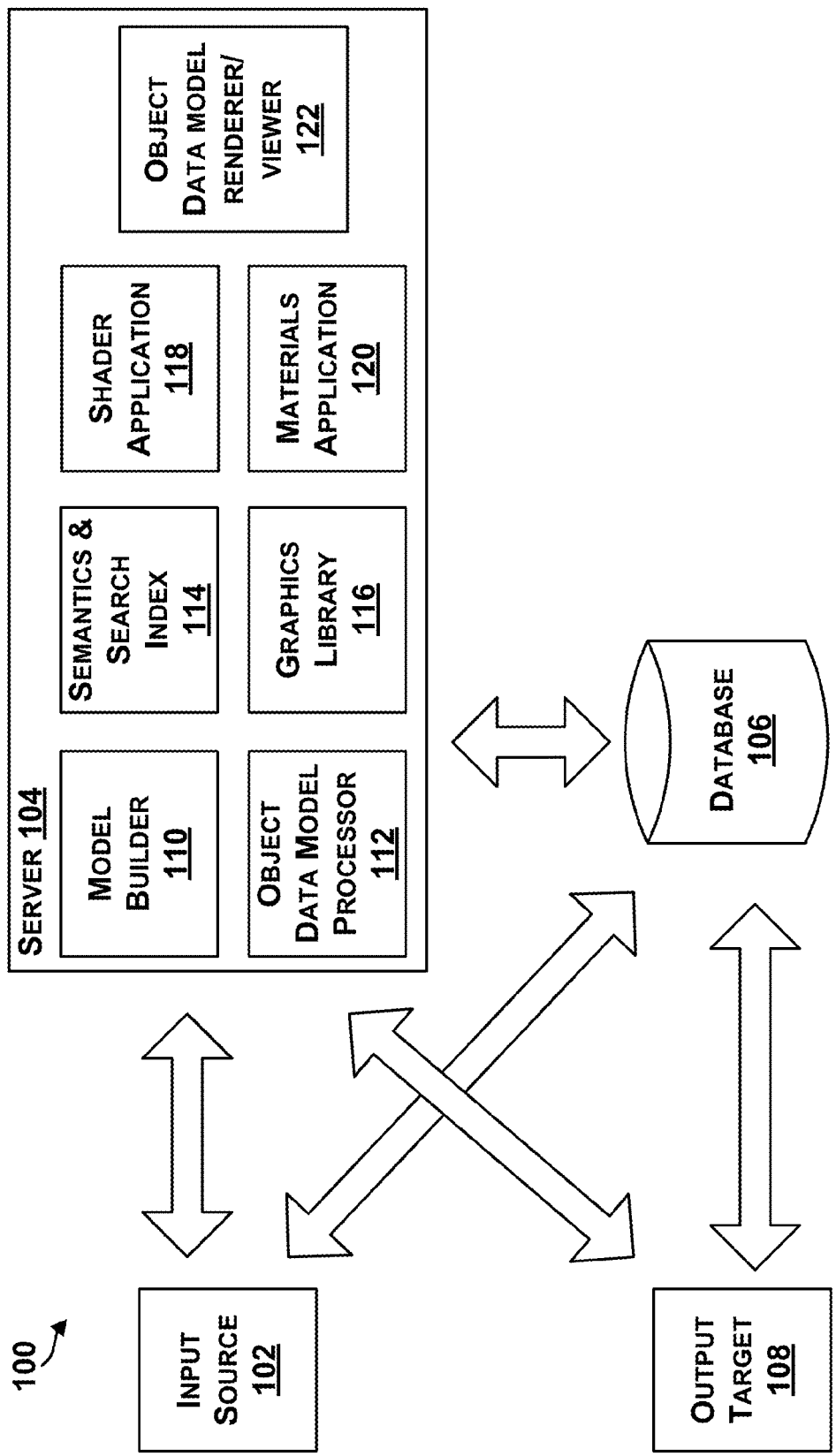
FIG. 1 illustrates an example system for object data modeling.

Referring now to the figures, FIG. 1 illustrates an example system 100 for object data modeling. The system 100 includes an input source 102 coupled to a server 104 and a database 106. The server 104 is also shown coupled to the database 106 and an output target 108. The system 100 may include more or fewer components, and each of the input source 102, the server 104, the database 106, and the output target 108 may comprise multiple elements as well, or each of the input source 102, the server 104, the database 106, and the output target 108 may be interconnected as well. Thus, one or more of the described functions of the system 100 may be divided up into additional functional or physical components, or combined into fewer functional or physical components. In some further examples, additional functional and/or physical components may be added to the examples illustrated by FIG. 1.

Components of the system 100 may be coupled to or configured to be capable of communicating via a network (not shown), such as a local area network (LAN), wide area network (WAN), wireless network (e.g., a Wi-Fi network), or Internet, for example. In addition, any of the components of the system 100 may be coupled to each other using wired or wireless communications. For example, communication links between the input source 102 and the server 104 may include wired connections, such as a serial or parallel bus, or wireless links, such as Bluetooth, IEEE 802.11 (IEEE 802.11 may refer to IEEE 802.11-2007, IEEE 802.11n-2009, or any other IEEE 802.11 revision), or other wireless based communication links.

The input source 102 may be any source from which a 3D object data model may be received. In some examples, 3D model acquisition (shape and appearance) may be achieved by working with venders or manufacturers to scan objects in 3D. For instance, structured light scanners may capture images of an object and a shape of the object may be recovered using monochrome stereo cameras and a pattern projector. In other examples, a high-resolution DSLR camera may be used to capture images for color texture information. In still other examples, a raw computer-aided drafting (CAD) set of drawings may be received for each object. Thus, the input source 102 may provide a 3D object data model, in various forms, to the server 104. As one example, multiple scans of an object may be processed into a merged mesh and assets data model, and provided to the server 104 in that form.

The server 104 includes a model builder 110, an object data model processor 112, a semantics and search index 114, a graphics library 116, a shader application 118, a materials application 120, and an object data model renderer/viewer 122. Any of the components of the server 104 may be coupled to each other. In addition, any components of the server 104 may alternatively be a separate component coupled to the server 104. The server 104 may further include a processor and memory including instructions executable by the processor to perform functions of the components of the server 104, for example.

The model builder 110 receives the mesh data set for each object from the input source 102, which may include a data set defining a dense surface mesh geometry, and may generate an animated model of the object in 3D. For example, the model builder 110 may perform coherent texture unwrapping from the mesh surface, and determine textures of surfaces emulated from the geometry.

The object data model processor 112 may also receive the mesh data set for each object from the input source 102 and generate display meshes. For instance, the scanned mesh images may be decimated (e.g., from 5 million to 120,000 surfaces) utilizing texture-preserving decimation. Texture map generation can also be performed to determine color texture for map rendering. Texture map generation may include using the mesh data sets (H) that have colors but no ultraviolet (UV) unwrapping to generate a mesh (D) with UV unwrapping but no colors. As an example, for a single output texture pixel of an image, processing may include, for a given point in UV, determine a triangle in the mesh's UV mapping (D), and using triangle-local coordinates, move to an associated 3D point on the mesh. A bidirectional ray may be cast along the triangle's normal to intersect with the mesh (H), and color, normal and displacement may be used for an output. To generate an entire texture image, each pixel in the image can be processed.

The semantics and search index 114 may receive captured images or processed images that have been decimated and compressed, and may perform texture resampling and also shape-based indexing. For example, for each object, the semantics and search index 114 may index or label components of the images (e.g., per pixel) as having a certain texture, color, shape, geometry, attribute, etc. The semantics and search index 114 may receive the 3D object data model file or files comprising the 3D object data model from the model builder 110 or the object data model processor 112, and may be configured to label portions of the file or each file individually with identifiers related to attributes of the file.

In some examples, the semantics and search index 114 may be configured to provide annotations for aspects of the 3D object data models. For instance, an annotation may be provided to label or index aspects of color, texture, shape, appearance, description, function, etc., of an aspect of a 3D object data model. Annotations may be used to label any aspect of an image or 3D object data model, or to provide any type of information. Annotations may be performed manually or automatically.

In examples herein, an annotated template of an object in a given classification or category may be generated that includes annotations, and the template may be applied to all objects in the given classification or category to apply the annotations to all objects. For example, the semantics and search index 114 may include a matching component and annotation component. The matching component and annotation component may take the form of a processor configured to execute instructions to perform functions. As an example, the matching component may be coupled to a database including annotated templates of 3D object data models that are associated with a given category of objects. The matching component may be configured to determine a matching correspondence between a first 3D object data model, that is an annotated template for a given category of objects, and a second 3D object data model that describes a given object in the given category. Additionally, the annotation component may be coupled to the matching component and may be configured to apply an annotation that is associated with a correspondence point of the first 3D object data model as a call-out to a matching correspondence point of the second 3D object data model. Thus, an annotated template may be matched to other objects in order to apply annotations to other objects in a category of objects.

The graphics library 116 may include a WebGL or OpenGL mesh compression to reduce a mesh file size, for example. The graphics library 116 may provide the 3D object data model in a form for display on a browser, for example. In some examples, a 3D object data model viewer may be used to display images of the 3D objects data models. The 3D object data model viewer may be implemented using WebGL within a web browser, or OpenGL, for example.

The shader application 118 may be configured to apply a shader to portions of the 3D object data model file or files of the 3D object data model according to the indexes of the file (as labeled by the semantics and search index 114) to generate a 3D image. The shader application 118 may be executed to apply a shader from a number of shaders according to the indexes of the file. The shader may include information related to texture, color, appearance, etc., of a portion of the 3D image.

In one example, the shader application 118 may be executed to render an image with shading attributes as defined by indexes of the files. For example, objects with multiple surfaces may have different attributes for each surface, and the shader application 118 may be executed to render each surface accordingly.

The materials application 120 may be configured to apply a material to portions of the 3D object data model file or to files of the 3D object data model according to the indexes of the file (as labeled by the semantics and search index 114) to generate a 3D image. The materials application 120 may be executed to apply a material from a number of materials according to the indexes of the file. The materials application may apply any material, such as leather, metal, wood, etc., so as to render an appearance of a portion of the 3D image.

In one example, the materials application 120 may access a database that includes information regarding a number of reference materials (e.g., brass, fur, leather), and objects with multiple materials may be separated into distinct portions. As an example, a hood on a car may include a hood ornament, and the hood may be painted while the ornament may have a chrome finish. The materials application 120 and the shader application 118 can be executed to identify two separate materials (e.g., the painted hood and the chrome hood ornament) and render each material with an appropriate shader.

The object data model renderer/viewer 122 may receive the 3D object data model file or files and execute the shader application 118 and the materials application 120 to render a 3D image.

The database 106 may store all data sets for a 3D object data model in any number of various forms from raw data captured to processed data for display.

The output target 108 may include a number of different targets, such as a webpage on the Internet, a search engine, a database, etc. The output target 108 may include a 3D object data model viewer that enables product advertisements or product searches based on the 3D object data model.

In examples herein, the system 100 may be used to acquire data of an object, process the data to generate a 3D object data model, and render the 3D object data model for display.

In some examples, annotations may be provided for aspects of the 3D object data models. For instance, an annotation may be provided to label or index aspects of color, texture, shape, appearance, description, function, etc., of an aspect of a 3D object data model. Annotations may be used to label any aspect of a 3D object data model or image of the 3D object data model, or to provide any type of information. Annotations may be performed manually or automatically. In examples herein, an annotated template of an object in a given classification or category may be generated that includes annotations, and the template may be applied to all objects in the given classification or category to apply the annotations to all objects.

Figure 2:
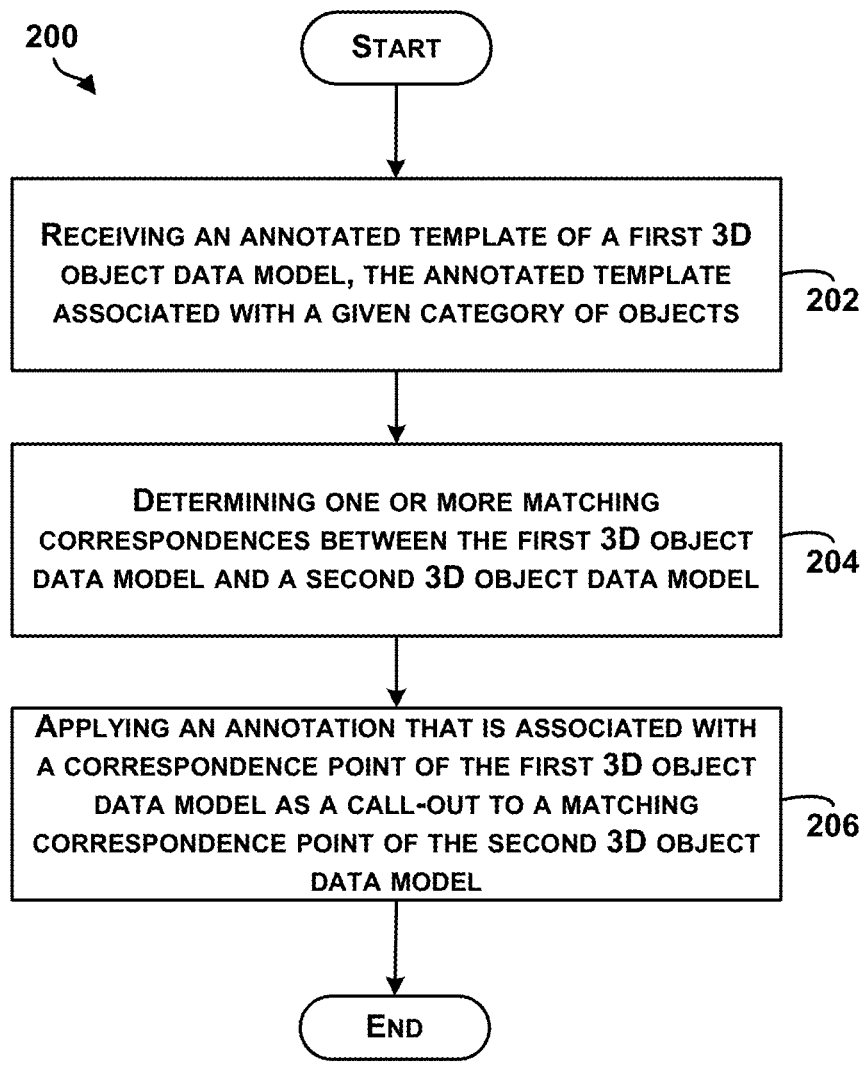
FIG. 2 is a block diagram of an example method for applying annotations for three-dimensional (3D) object data models.

FIG. 2 is a block diagram of an example method 200 for applying annotations for three-dimensional (3D) object data models. Method 200 shown in FIG. 2 presents an embodiment of a method that could be used by the system 100 of FIG. 1 or components of the system 100, for example. Method 200 may include one or more operations, functions, or actions as illustrated by one or more of blocks 202-206. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

In addition, for the method 200 and other processes and methods disclosed herein, the block diagram shows functionality and operation of one possible implementation of present embodiments. In this regard, each block may represent a module, a segment, or a portion of program code, which includes one or more instructions executable by a processor or computing device for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device.

In addition, for the method 200 and other processes and methods disclosed herein, each block in FIG. 2 may represent circuitry that is wired to perform the specific logical functions in the process.

Initially, at block 202, the method 200 includes receiving an annotated template of a first 3D object data model. A server or computing device may receive the annotated template from a number of sources, such as an input by a user or a template stored in a database. The annotated template may be associated with a given category of objects. For instance, the annotated template of the object may be manually created by a user as a model for placement of annotations to use for objects within a classification. In some examples, a database may store annotated templates for multiple categories of objects, and an annotated template may be received from the database based on information identifying a given category for a candidate 3D object data model that is to be annotated.

As an example, a user may manually identify aspects of a 3D object date model of a shoe (e.g., label a front, sole, heel, laces, etc.), and the template can be assigned to a general classification of shoes. In a further example, individual categories of shoes may include annotated templates. For instance, categories of shoes such as running shoes, men's shoes, women's shoes, sandals, etc. may include annotated templates. Thus, the annotated template may be associated with a given category of objects.

In some examples, an annotated template may include one or more annotations to one or more aspects of an object described by the first 3D object data model. In the example in which the annotated template is a shoe, the one or more annotations may identify attributes of the aspects of the shoe (e.g., name of the aspect, color of the aspect, texture of the aspect, etc.). Thus, the annotated template may include annotations that identify information associated with attributes of the one or more aspects of the object.

At block 204, the method 200 includes determining one or more matching correspondences between the first 3D object data model and a second 3D object data model. In one example, the second 3D object data model may describe a given object in the given category that the annotated template is associated with. For instance, the annotated template may be associated with men's walking shoes, and the second 3D object data model may describe a type of men's walking shoe.

Many methods and techniques exist for determining matching correspondences between two 3D object data models. In one example, surface correspondences between two 3D object models may be found between surfaces that are approximately and/or partially isometric. The problem of determining matching correspondences may be described as trying to find correspondences between two sets of discrete points that are each sampled from a separate surface. Example methods may focus on measuring and minimizing deformation error between a set of correspondences.

As an example, a deformation error may be defined that models deviations from isometry. For instance, a variant of the Gromov-Hausdorff distance may be used. The reference "On the Use of Gromov-Hausdorff Distances for Shape Comparison", by F. Memoli, Eurographics Symposium on Point-Based Graphics 2007, Prague, September 2007 describes an example, and is incorporated herein in its entirety. The Gromov-Hausdorff distance is able to detect the metric similarity between shapes as it operates on their metric structure, that is, shapes are viewed as metric spaces. This notion of distance compares the full metric information contained in the shapes, as opposed to other notions that may only compare simple (incomplete) invariants. Therefore, two shapes will be declared equal if and only if they are isometric. This means that the invariance properties are to be encoded by the metrics one chooses to endow the shapes with. For example, if the shapes are endowed with Euclidean metrics, the underlying invariance is to rigid isometries.

A modification and expansion of the original Gromov-Hausdorff notion of distance between metric spaces is introduced which takes into account probability measures defined on measurable subsets of these metric spaces. This new definition allows for a discretization which is more natural and more general. The probability measure can be thought of as indicating the importance of the difference points in the dataset.

In other examples, matches between mesh topologies of 3D object data models may be considered to determine whether two objects have continuity (e.g., interpolations between a donut and a coffee cup may be mapped together since each have holes—a hole in the center for a donut and a hole in the handle for the coffee cup—but such a mapping is improper).

In examples herein, any number, type, or combination of metrics for computing correspondences between 3D shapes can be used. Examples leverage metrics between surface information, metrics between appearance information, and metrics between volume information, and each of these properties (surface, material appearance/texture, volume) may all provide information for computing correspondences.

As one example, a combination of geometric correspondence and material correspondence may be used to determine matching correspondences. For example, a material property of a first portion of a first shape may be assigned a numeric value and a material property of a second portion of a second shape may also be assigned a numeric value. A material distance measure may be computed between the numeric values (e.g., a material distance measure of zero may indicate a close match while a larger material distance measure may be indicative of a weak match). In some instances, a material distance measure may be used to strengthen or weaken correspondences that are determined based on geometric properties. The term geometric properties may broadly refer to properties associated with one or more three-dimensional coordinates of a 3D object data model such as three-dimensional position, surface normal, or curvature. The three-dimensional coordinates may form a point cloud or surface mesh, for example. Additionally, geometric properties may refer to properties associated with a volume or topology of a 3D object data model.

In some examples, correspondences between a volume of the first 3D object data model and the second 3D object data model may be determined. For instance, matching correspondences may be matches between a point on an interior of the first 3D object data model and a point on an interior of the second 3D object data model.

Other possible example techniques for determining matching correspondences between two 3D object data models include comparisons based on volume-based descriptors, image-based descriptors, (e.g., by comparing 2D projections of the 3D object data models), skeletons of 3D object data models, and iterative closest point (ICP) algorithms, among other possibilities.

The following references, each of which is incorporated herein in its entirety, describe additional example methods or techniques for computing correspondences: "A spectral notion of Gromov-Wasserstein distances and related methods", by F. Memoli, Journal of Applied and Computational Harmonic Analysis, May 2011; "Mobius Voting for Surface Correspondence", by Y. Lipman et al., ACM Transactions on Graphics, August 2009; "Blended Intrinsic Maps", by V. G. Kim et al, ACM Transactions on Graphics, August 2011; and "Exploring Collections of 3D Models using Fuzzy Correspondences", by V. G. Kim et al, ACM Transactions on Graphics, August 2012. In the example of Mobius voting, for instance, an iterative algorithm including sampling a triplet of three random points from each of two point sets, using the Mobius transformation defined by those triplets to map both point sets into a canonical coordinate frame on the complex plan, and producing "votes" for predicted correspondences between the mutually closest points with magnitude representing their estimated deviation from isometry. The result of this process is a fuzzy correspondence matrix, which is converted to a permutation matrix with simple matrix operations and output as a discrete set of point correspondences with confidence values.

In some examples, block 204, including determining the one or more matching correspondences, may be performed by a shape-matching server (e.g., a matching component having a processor and a memory), and a server performing the method 200 may receive from the shape-matching server, information indicating the matching correspondences. Thus, the function of block 204 may be performed by a given entity and outputs may be provided to an entity that performs the method 200, for example.

At block 206, the method 200 includes applying an annotation that is associated with a correspondence point of the first 3D object data model as a call-out to a matching correspondence point of the second 3D object data model. For example, one or more of the annotations associated with aspects of the object may be associated with a point of the first 3D object data model that has a matching correspondence point on the second 3D object data model. As a result, the annotation (e.g., a name of an aspect of the object described by the first 3D object data model) may be mapped to the matching correspondence point on the second 3D object data model. As described previously, the matching correspondence point may be a point on a surface of the second 3D object data model or a point on an interior of the second 3D object data model.

The matching correspondence point on the second 3D object data model may also be an anchor point for a call-out. In some examples, the call-out may facilitate changing an orientation or pose of the 3D object data model. In other examples, the call-out out may provide labels for aspects of an object (e.g., attributes such as name, style, texture, etc.). In still other examples, the call-out may include an advertisement.

In one example, block 206 may be performed by an annotation component that receives matching correspondences and an indication of one or more annotations associated with correspondence points of the first 3D object data model. Based on the received information, the annotation component may map the annotations to the matching correspondence points of the second 3D object data model as call-outs.

As a specific example, the object having the annotated template may be a shoe and annotations may include information identifying locations of a sole, heel, laces, etc. Information of the first 3D object data model for the sole, heel, and laces may be used to find matching correspondences of other shoes, and locations of the sole, heel, and laces of the other shoes may be determined. Annotations associated with the annotated template may subsequently be applied to 3D object data models of the other shoes at the locations of the sole, heel, and laces.

In some examples, an annotated template may include more aspects and annotations than may apply for a given object in a category related to the template. For instance, a template of a shoe may include a sole, heel, and laces; however, another shoe being compared to the template may not include laces. In such examples, all annotations that may be applied can be assigned, while others can be ignored (e.g., if a matching correspondence point is not found for a given aspect of the annotated template having an annotation).

In a further example, a classification document for the given object described by the second 3D object data model may be received. For example, a user may provide the classification document or the classification document may be retrieved from a database. The classification document may include information associated with custom call-outs for the given object, and may be defined based on an (Extensible Markup Language) XML schema for instance. In one example, the custom call-outs may include custom information to associate with identified locations of aspects of the object. For instance, rather than having a call-out display a default identifier of an insole of a shoe, an advertisement for an orthopedic insert for a shoe may be stored as a custom call-out for the determined position of the insole. In another example, a manufacturer may provide, within a classification document associated with an object, custom names for aspects of an object that can be associated with default aspects of the object that are identified by a matching component. For instance, an annotated template may include identifications of a heel, sole, and laces, and an example classification document may include information such as: "heel: 'Maximum Support Heel'; sole: 'Non-slip Sole'; laces: 'Water-resistant Laces' . . . ". Various other examples for customizing information associated with an identified aspect of the second 3D object data model are contemplated.

In some instances, the method 200 may be performed to scale up hand labeling and adding of semantic information to a number of 3D object data models in an automatic fashion. For example, this may be achieved by manually labeling one 3D object data model per category or classification and applying the annotated 3D object data model to other 3D object data models for the category based on matching correspondences. After the other 3D object data models have been annotated, the annotated other 3D object data models may be stored in a database or provided to another computing device (e.g., for display).

Figure 3:
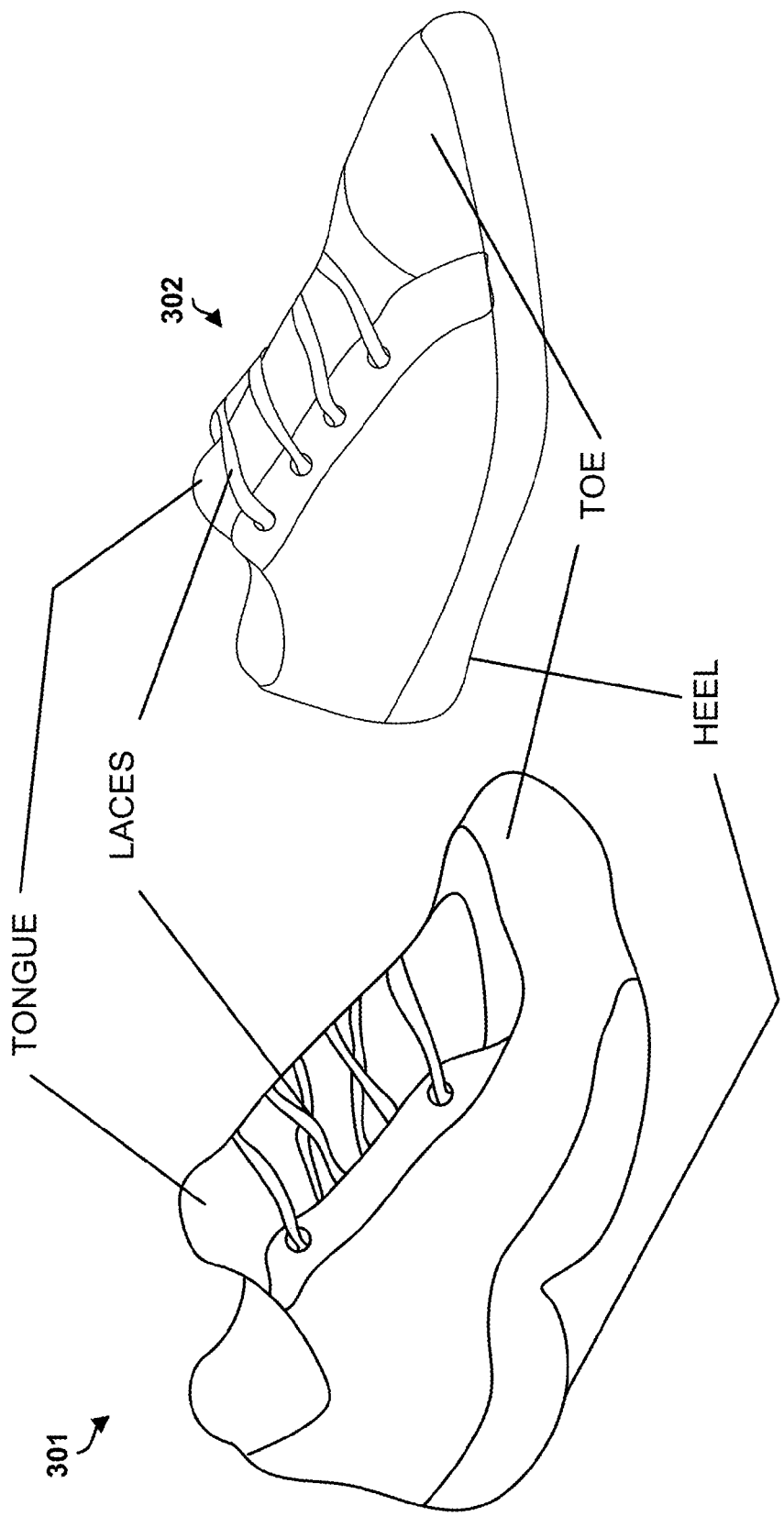
FIG. 3 conceptually illustrates examples of annotated templates of three-dimensional (3D) object data models.

FIG. 3 conceptually illustrates examples of annotated templates 301, 302 of three-dimensional (3D) object data models. As shown in FIG. 3, a first annotated template 301 may be a 3D object data model of an athletic shoe and a second annotated template 302 may be a 3D object data model of a walking/casual shoe. Each of the annotated templates 301, 302 may include annotations to four aspects of the shoes. For example, the annotations may be information identifying a tongue, laces, toe, and heel of each of the shoes.

In one example, the annotated template 301 may be matched to other 3D object data models of athletic shoes to automatically identify locations of the tongue, laces, toe, and heel on the other 3D object data models. Similarly, the annotated template 302 may be matched to other 3D object data models of walking/casual shoes to identify locations of the tongue, laces, toe, and heel.

The annotated templates 301, 302 are provided as examples of an annotated template and are not meant to be limiting. For instance, an annotated template may include more or less annotated aspects and may be of any size and resolution.

Figure 4B:
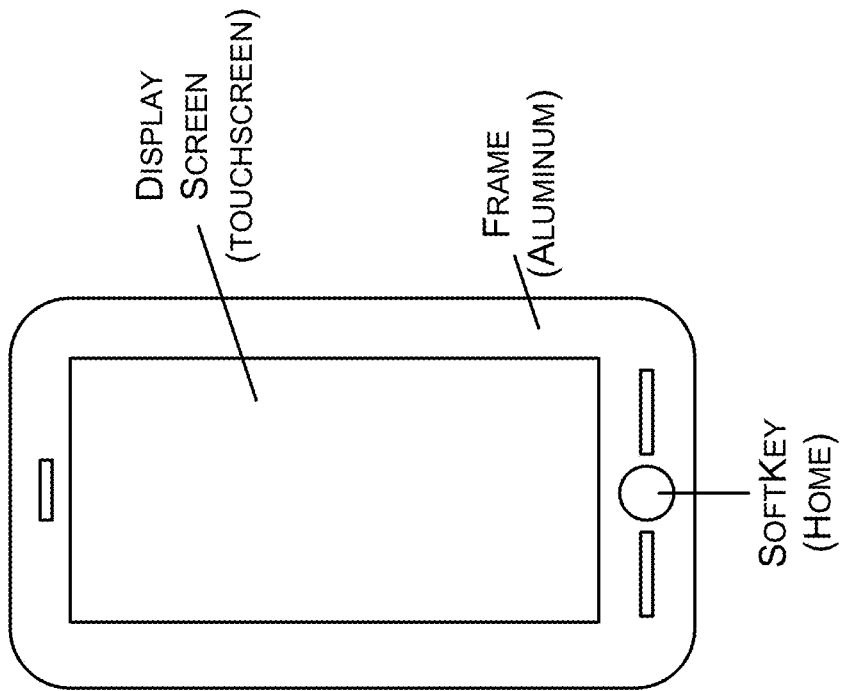
Figure 4A:
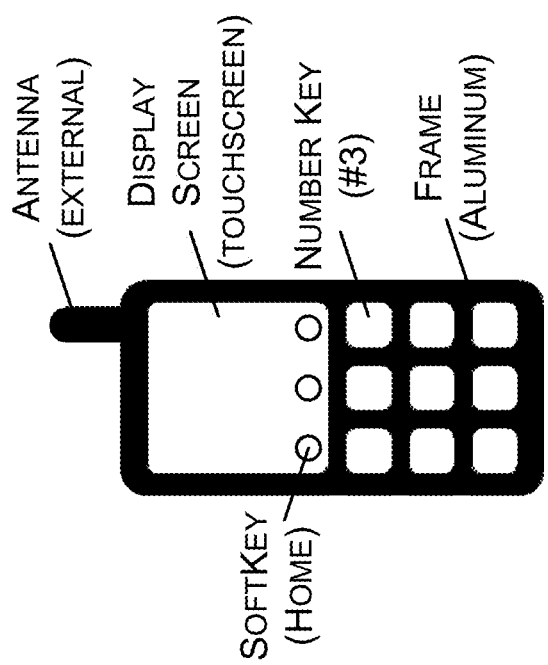

FIGS. 4A-4C conceptually illustrate examples of applying an annotated template of a three-dimensional (3D) object data model to a given 3D object data model. FIG. 4A illustrates a rendering of a template of an annotated 3D object data model of a mobile or cellular telephone. The annotations include information identifying an antenna, a display screen, a number key, a frame, and a softkey. Additionally, attributes associated with the aspects include information identifying a material of the frame (aluminum), a number for the key (#3), a type of display screen (touchscreen), a type of antenna (external), and a type of softkey (home). Other information may also be included.

FIG. 4B illustrates a rendering of a 3D object data model that belongs to the same category as the template in FIG. 4A, for example, a category of mobile telephones. Thus, the template of FIG. 4A may be applied to the 3D object data model of FIG. 4B. All matching correspondences between the two objects (e.g., frame, display screen, softkeys) can be identified, and the annotations from the template can be applied to the object in FIG. 4B as shown. For annotations of the template that do not find matching correspondences in the given object, such as an external antenna or a number key, those annotations may be ignored.

FIG. 4C illustrates an example conceptual 3D display of the 3D object data model of FIG. 4B. As shown, call-outs are provided with information about attributes for the respective components of the object. In some instances, the call-outs may be provided while the 3D object data model is presented within a 3D image viewer.

Figure 5A:
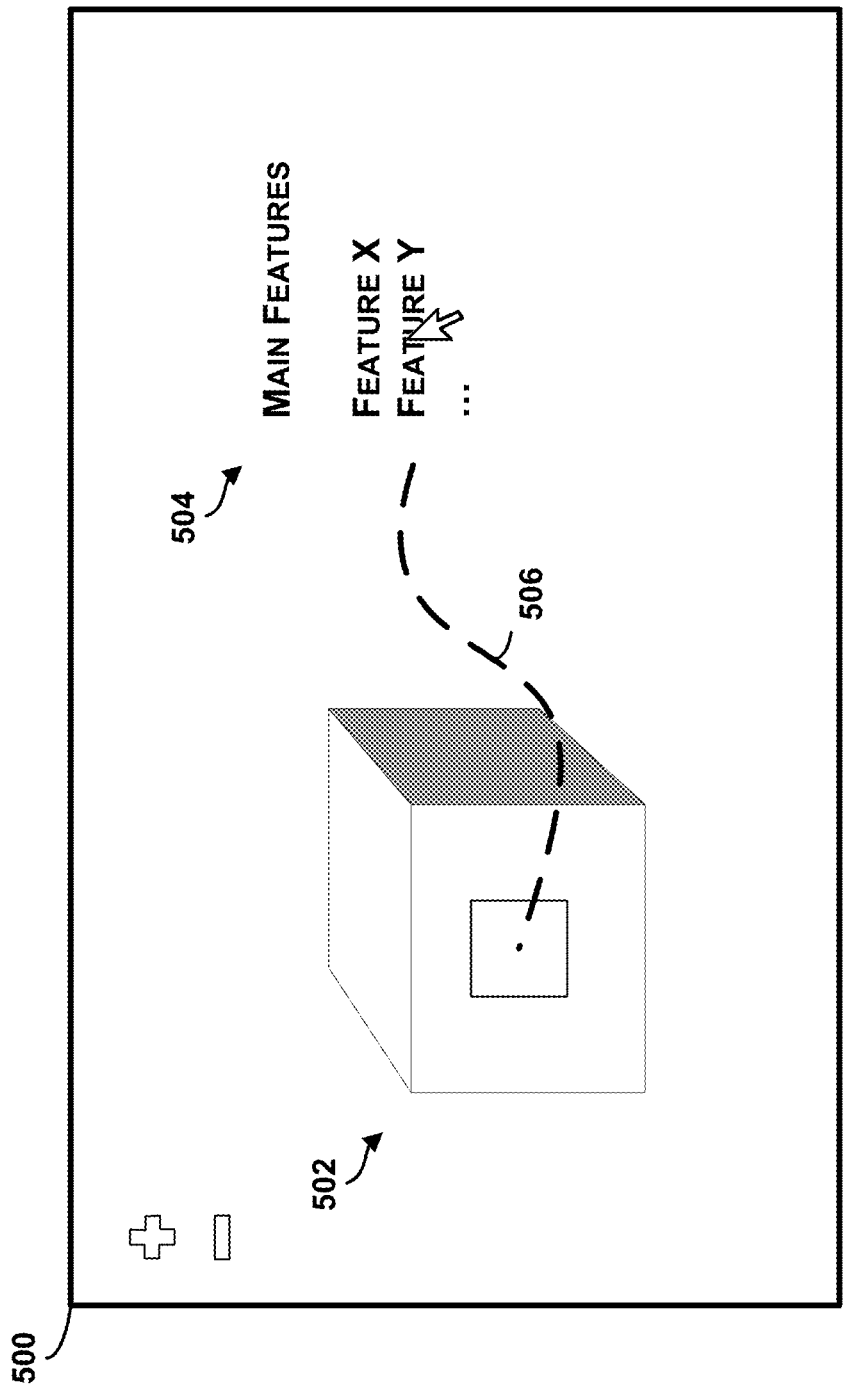
FIGS. 5A and 5B show example displays of a three-dimensional (3D) image viewer.
Figure 5B:
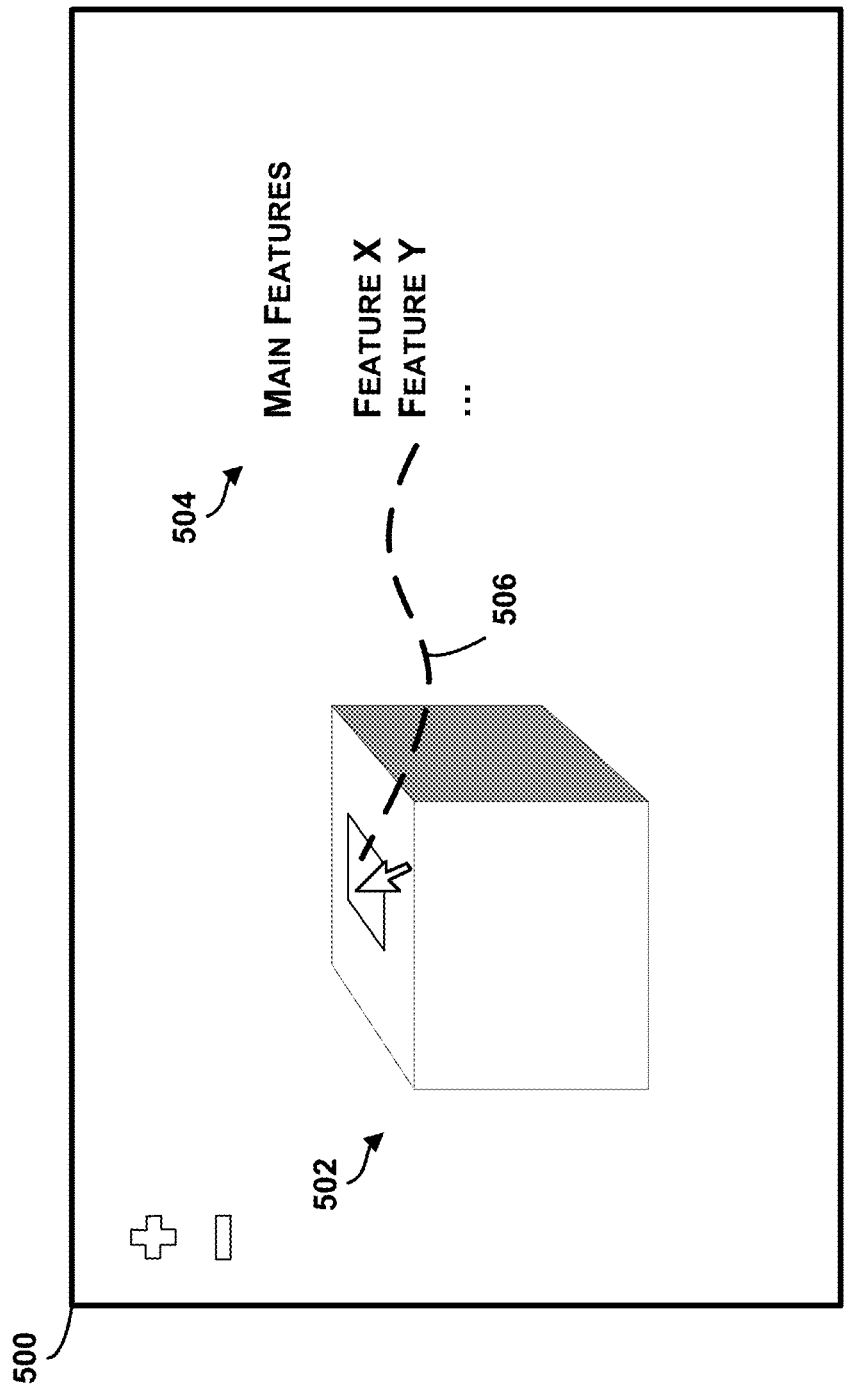

FIGS. 5A and 5B show example displays of a three-dimensional (3D) image viewer. In one example, the 3D image viewer may be provided within a webpage. The webpage may include miscellaneous information and content such as textual content, graphics, hyperlinks, etc. The 3D image viewer may be configured to render a 3D image representing a 3D object data model of an object. In one instance, the 3D image viewer may be configured to receive a 3D object data model file from a server having data for rendering the 3D image.

As shown in FIG. 5A, a display 500 may include a 3D image 502 and an overlay 504. For example, the overlay may be a call-out or group of call-outs associated with aspects of an object described by the 3D image 502. Although the overlay 504 is represented as a list, the overlay 504 may be composed of multiple overlays that are positioned within the display 500 and around the 3D image 502. The overlay 504 may be defined by plain HTML (e.g., text strings with style characteristics). In some examples, embedded language associated with the 3D image viewer may describe control of the overlay 504. For example, a separate file referenced in embedded language of a webpage or associated with the 3D object data model may specify where the overlay 504 is rendered with respect to the 3D image 502.

As an example, a position of the overlay 504 may be defined relative to a position of the 3D image 502. For instance, the overlay 504 may be attached to a geometric location on or near the 3D image 502 as determined based on matching correspondences between a 3D object data model and an annotated template.

In one example, a user may click on or otherwise select a portion of the overlay 504, and an action may occur. For instance, a user may click on "Feature Y" and a line 506 may be rendered between the location of the overlay 504 and a geometric position of the "Feature Y" on the 3D image 502. In some examples, this may be accomplished based on anchors associated with the overlay 504 in the embedded language. For instance, the overlay 504 or a portion of the overlay 504 may be associated with a geometric position of the 3D object data model represented by the 3D image 502.

In some examples, the 3D image 502 may be in a first orientation at a first instance in time prior to the user clicking on the overlay 504. After the user clicks on the overlay 504, the 3D image 502 may animate to move to a different orientation. For instance, a camera angle of the 3D image 502 may be modified so that the 3D image 502 rotates and the "Feature Y" of the 3D image 502 is oriented towards a user (not shown).

As shown in FIG. 5B, in another example, a user may click on or otherwise indicate a position of the 3D image 502. In one instance, in response to the indication, a line 506 may be rendered from a component of the 3D image 502 to a position with respect to the overlay 504 associated with the position on the 3D image 502. Thus, in some examples, overlays, such as call-outs within the 3D image viewer may be associated with one or more components of a 3D object data model.

In some examples, the line 506 may be a stretchable animation that lengthens if the 3D image 502 is rotated. For instance, if a user clicks and drags on the 3D image 502 to rotate the image to the left, the line 506 may extend as the 3D image 502 rotates. In some examples, if the 3D image 502 rotates more than a predetermined amount (e.g., 10 degrees) the line 506 may disappear.

In a further example, the 3D position of the line 506 may also be modified as the 3D image 502 rotates such that the line 506 does not intersect the interior of the 3D image 502 during small rotations or translations. For example, if the 3D image 502 rotates to the left, 3D positions along a path of the line 506 may be modified such that the path is moved farther away from the position of the 3D image 502 (e.g., moved in a direction that is perpendicular to a plane of the display 500 and towards a viewer of the display). Thus, if the 3D image 502 is rotated, in some instances, the line 506 may stretch and still remain outside of the 3D image 502.

The process of determining modifications to the 3D position of the line 506 due to rotations or translations of the 3D image may also be automated. For instance, given inputs of a 3D coordinate on the 3D image 502 and a 3D coordinate of an overlay (e.g., the location of the text "Feature Y"), an initial smooth path or route between the two 3D coordinates may be determined which does not intersect the 3D image 502. Additionally, modified paths may be determined in advance for various rotations (i.e., rotate up, rotate down, rotate left, rotate right, etc.) and translations (slide right, slide left, slide up, slide down, etc.). The modified paths may be implemented when the 3D image 502 is rotated. For instance, if the image is rotated upwards and to the left, the path of the line 506 may be modified based on a combination of the modified paths associated with upward and leftward rotations.

It is also contemplated that call-outs may be provided for static 2D images of objects. For example, one or more 2D images of an object may be rendered based on a 3D object data model of an object. The 2D images may include anchors for call-outs such that lines similar to the line 506 may be rendered from a component of the 2D image when the component or an overlay associated with the component is selected. In one embodiment, a gallery of 2D images may be provided having multiple viewpoints of a 3D object data model. The gallery may provide functionality similar to the functionality of the display 500 of FIGS. 5A and 5B. For instance, a line may be displayed between a component and a label for the component when either the component or the line is selected.

Figure 6:
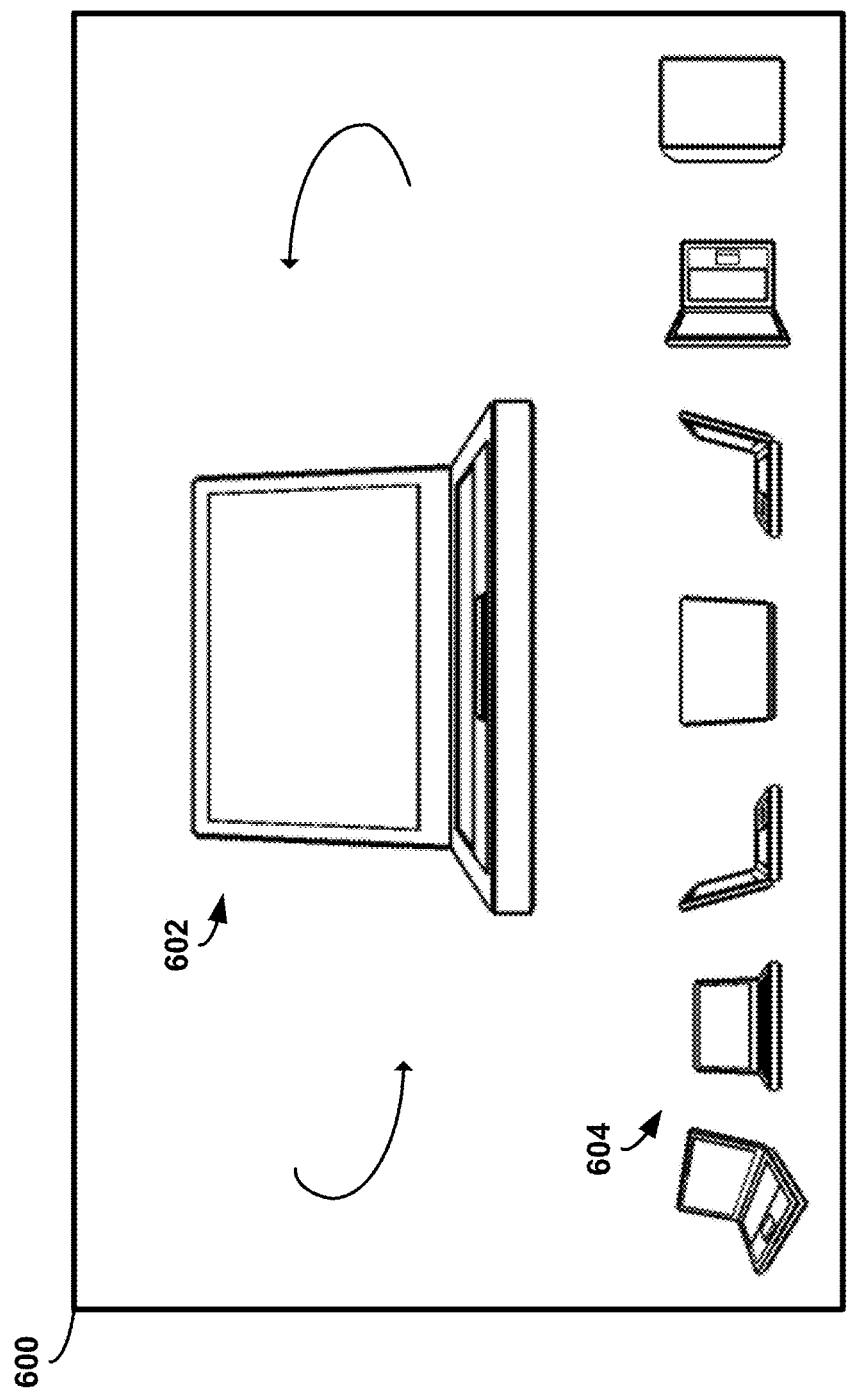
FIG. 6 shows another example display of a three-dimensional (3D) image viewer.

FIG. 6 shows another example display of a three-dimensional (3D) image viewer 600. As shown in FIG. 6, the 3D image viewer 600 may be configured to display an image 602 of an object. For example, the image 602 may be an image captured from a rendering of the 3D object data model having a front camera position. In some examples, a user may click or otherwise input a modification to the 3D viewer to cause other images of the object to be displayed. For example, the other images may be images of the object rendered from separate positions around an axis of rotation of the object. In one instance, a user may click and drag to the left or right to cause the image 702 displayed by the 3D image viewer 600 to change. In another example, a user may perform a gesture (e.g., a swipe) on a touchscreen interface to cause the image 602 displayed by the 3D image viewer 600 to be replaced by a different image.

Additionally, the 3D image viewer 600 includes multiple snapshots 604 a user may select to cause the image 602 displayed by the 3D image viewer 600 to rotate to a given image. For example, the snapshots 604 may include a perspective, front, right, back, left, top, and bottom view images. In one example, a user may select a top snapshot, and the image 602 may fade out. Subsequently, an image generated based on a rendering of the 3D object data model from a top camera position may fade in. In another example, a user may select a right snapshot, and the image displayed by the 3D image viewer may animate through a number of images captured between the front and right of the 3D object data model before displaying an image generated based on a rendering of the 3D object model from a right camera position. For instance, if the right snapshot is an image captured at 90 degrees and the image 602 displayed by the 3D image viewer 600 is an image captured at 0 degrees, the 3D image viewer 600 may sequentially display images at camera positions between 0 degrees and 90 degrees (e.g., 5 degrees, 10 degrees, 15 degrees . . . 85 degrees).

In one example, information associated with a perspective, front, right, back, left, top, and bottom of a 3D object data model may be determined by matching the 3D object data model to an annotated template for a given category of objects to which the 3D object data model belongs. The annotated template may be a template 3D object data model including information identifying a perspective, front, right, back, left, top, and bottom, and based on matching correspondences between the two 3D object data models, the 3D object data model may be annotated with information identifying a perspective, front, right, back, left, top, and bottom. Given the identified positions, images of the 3D object data model may be rendered for each of the snapshots 604. Additionally, based on the determined positions, an axis of rotation between the top and bottom may be identified and used to render images at intervals between the front, left, right, and back of the 3D object data model. Thus, an annotated template and shape matching may be used to facilitate annotating a 3D object data model for display within a 3D image viewer having snapshots for predetermined positions (e.g., a swivel viewer).

Additionally, automatically (and optionally manually) assigned call-outs for a 3D object data model may further be modified based on an analysis of user interaction with the call-outs.

Figure 7:
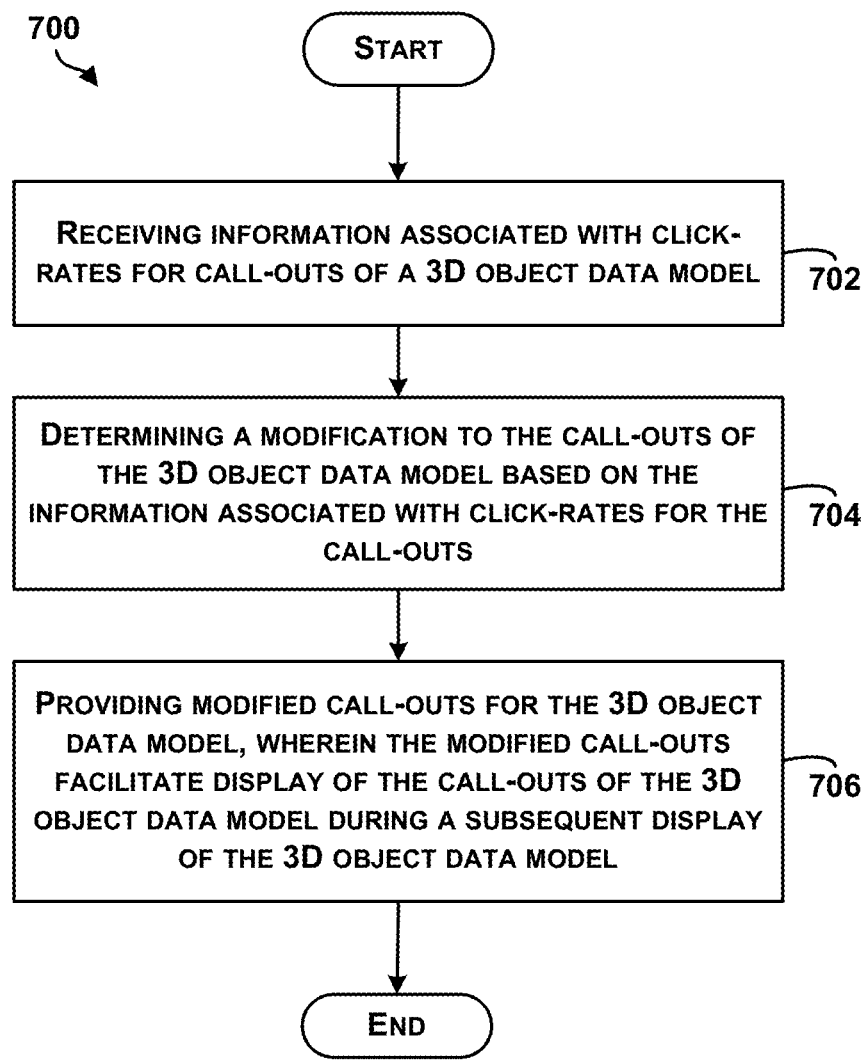
FIG. 7 is a block diagram of an example method for determining a modification to call-outs for a three-dimensional (3D) object data model.

FIG. 7 is a block diagram of an example method 700 for determining a modification to call-outs for a three-dimensional object data model. Method 700 may include one or more operations, functions, or actions as illustrated by blocks 702-706. Although the blocks are illustrated in a sequential order, these blocks may also be performed in parallel, and/or in a different order than those described herein. Also, the various blocks may be combined into fewer blocks, divided into additional blocks, and/or removed from the flow chart, based upon the desired implementation of the method 700. Each block may represent a module, a segment, or a portion of program code, which includes one or more instructions executable by a processor for implementing specific logical functions or steps in the process. In addition, each block in FIG. 7 may represent circuitry that is wired to perform the specific logical functions in the process.

Initially, at block 702, the method 700 includes receiving information associated with click-rates for call-outs of a 3D object data model. For example, click-rates may be determined based on frequencies with which given call-outs are selected while the 3D object data model is rendered on a display. As an example, a 3D object data model may include five call-outs associated with five aspects of the 3D object data model. The 3D object data model may be provided within a 3D image viewer at ten different instances. The number of times a call-out was clicked (or otherwise selected based on a type of user interface), by clicking at a location of the 3D object data model or an overlay, for example, may be determined for each of the five call-outs. Thus, a click-rate may represent or number of times a call-out was selected over a given time period or a frequency with which the call-out was selected (e.g., 2 out of every 10 views, the $2^{nd}$ most-clicked call-out, etc.). Additionally, the call-outs may be sorted based on click-rate.

At block 704, the method 700 includes determining a modification to the call-outs of the 3D object data model based on the information associated with click-rates for the call-outs. In some instances, some call-outs may be clicked more often than others. Accordingly, in one example, the call-outs may be modified such that a call-out associated with an aspect having the lowest click-rate is filtered out and no longer presented in future viewings of the 3D object data model.

At block 706, the method 700 includes providing modified call-outs for the 3D object data model. For example, information indicating any change or modification to a call-out (e.g., hiding a call-out having a lowest click-rate from view) may be stored in a database. The modified call-outs for the 3D object data model may facilitate display of the call-outs of the 3D object data model during a subsequent display of the 3D object data model. In some examples, modifying the call-outs of a 3D object data model or group of 3D object data models may lead to a cleaner (e.g., less crowded) display of the 3D object data model where interesting and highly clicked call-outs are presented while other less popular call-outs are deemphasized or not displayed.

In some instances, the method 700 may further include determining click-rates for call-outs associated with 3D object data models of a given category. For instance, click-rates for aspects of a given category of 3D object data models may be determined across the category. Subsequently, call-outs for the 3D object data models of the given category may be modified based on the total click-rates for the given category. Alternatively, a sample of click-rates may from viewings of a portion of 3D object data models may be determined and used to modify call-outs for all 3D object data models of the given category.

In an instance in which an advertiser wishes to associate an advertisement with an aspect of a 3D object data model as a call-out, the placement of the advertisement may be modified or prioritized such that the advertisement is associated with a call-out having the highest click-rate. For example, an advertisement may be displayed whenever a call-out or an aspect of the 3D object data model associated with the call-out is selected. The advertisement may take any number of forms such as text, an image, a video, audio, a multimedia file, etc. Thus, advertisements associated with call-outs may be prioritized and rearranged based on click-rates associated with call-outs over a number of viewings or predetermined period of time.

In another example, information associated with click-rates for call-outs of a 3D object data model may include metadata or other logged information indicating call-outs selected prior to a purchase of a product represented by the 3D object data model. For instance, the 3D object data model having call-outs may be provided as part of a shopping experience, and the information associated with call-outs may be provided to manufacturers as feedback. The feedback may be indicative of types of call-outs that are conducive to sales of a product, for instance. In some instances, call-outs for a 3D object data model may be modified based on a factor that is based on both the total click-rate as well as number of clicks associated with purchases. For example, the factor may be a weighted average of total clicks and number of clicks associated with purchases. Thus, information associated with selections of call-outs prior to purchases of a product may also be stored, analyzed, and utilized for modification of call-outs of a 3D object data model.

Figure 8:
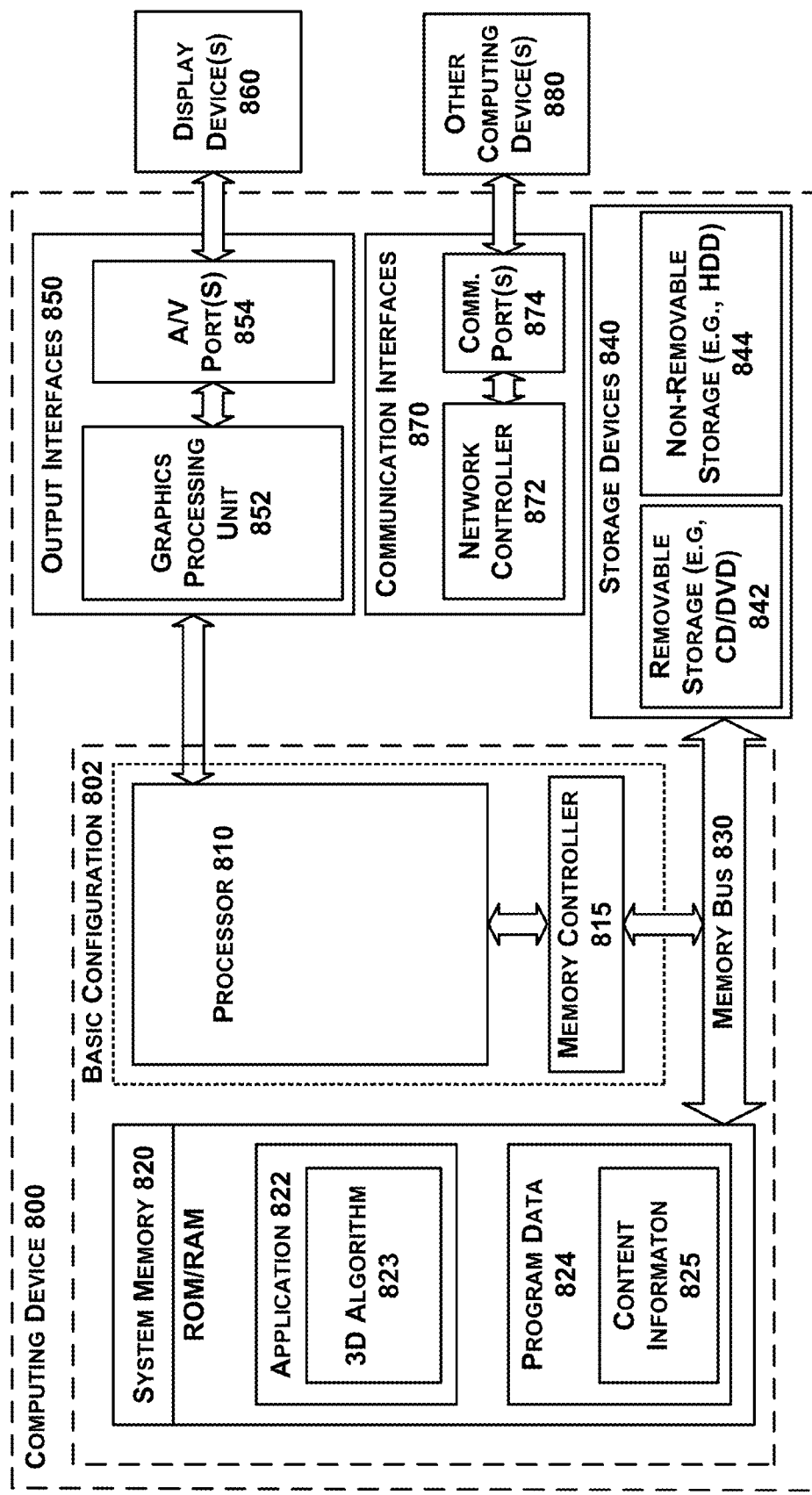
FIG. 8 is a functional block diagram illustrating an example computing device used in a computing system that is arranged in accordance with at least some embodiments described herein.

FIG. 8 is a functional block diagram illustrating an example computing device 800 used in a computing system that is arranged in accordance with at least some embodiments described herein. The computing device 800 may be a personal computer, mobile device, cellular phone, touch-sensitive wristwatch, tablet computer, video game system, or global positioning system, and may be implemented to provide a method for applying annotations for three-dimensional (3D) object data models and/or determining modifications to call-outs for 3D object data models as described in FIGS. 1-7. In a basic configuration 802, computing device 800 may typically include one or more processors 810 and system memory 820. A memory bus 830 can be used for communicating between the processor 810 and the system memory 820. Depending on the desired configuration, processor 810 can be of any type including but not limited to a microprocessor (μP), a microcontroller (μC), a digital signal processor (DSP), or any combination thereof. A memory controller 815 can also be used with the processor 810, or in some implementations, the memory controller 815 can be an internal part of the processor 810.

Depending on the desired configuration, the system memory 820 can be of any type including but not limited to volatile memory (such as RAM), non-volatile memory (such as ROM, flash memory, etc.) or any combination thereof. System memory 820 may include one or more applications 822, and program data 824. Application 822 may include a 3D algorithm 823 that is arranged to provide inputs to the electronic circuits, in accordance with the present disclosure. Program data 824 may include content information 825 that could be directed to any number of types of data. In some example embodiments, application 822 can be arranged to operate with program data 824 on an operating system.

Computing device 800 can have additional features or functionality, and additional interfaces to facilitate communications between the basic configuration 802 and any devices and interfaces. For example, data storage devices 840 can be provided including removable storage devices 842, non-removable storage devices 844, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Computer storage media can include volatile and nonvolatile, non-transitory, removable and non-removable media implemented in any method or technology for storage of information, such as computer readable instructions, data structures, program modules, or other data.

System memory 820 and storage devices 840 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 800. Any such computer storage media can be part of computing device 800.

Computing device 800 can also include output interfaces 850 that may include a graphics processing unit 852, which can be configured to communicate to various external devices such as display devices 860 or speakers via one or more A/V ports or a communication interface 870. The communication interface 870 may include a network controller 872, which can be arranged to facilitate communications with one or more other computing devices 880 over a network communication via one or more communication ports 874. The communication connection is one example of a communication media. Communication media may be embodied by computer readable instructions, data structures, program modules, or other data in a modulated data signal, such as a carrier wave or other transport mechanism, and includes any information delivery media. A modulated data signal can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media.

Computing device 800 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 can also be implemented as a personal computer including both laptop computer and non-laptop computer configurations.

In some embodiments, the disclosed methods may be implemented as computer program instructions encoded on a non-transitory computer-readable storage media in a machine-readable format, or on other non-transitory media or articles of manufacture. FIG. 9 is a schematic illustrating a conceptual partial view of an example computer program product 900 that includes a computer program for executing a computer process on a computing device, arranged according to at least some embodiments presented herein.

In one embodiment, the example computer program product 900 is provided using a signal bearing medium 901. The signal bearing medium 901 may include one or more programming instructions 902 that, when executed by one or more processors may provide functionality or portions of the functionality described above with respect to FIGS. 1-8. In some examples, the signal bearing medium 901 may encompass a computer-readable medium 903, such as, but not limited to, a hard disk drive, a Compact Disc (CD), a Digital Video Disk (DVD), a digital tape, memory, etc. In some implementations, the signal bearing medium 901 may encompass a computer recordable medium 904, such as, but not limited to, memory, read/write (R/W) CDs, R/W DVDs, etc. In some implementations, the signal bearing medium 901 may encompass a communications medium 905, such as, but not limited to, a digital and/or an analog communication medium (e.g., a fiber optic cable, a waveguide, a wired communications link, a wireless communication link, etc.). Thus, for example, the signal bearing medium 901 may be conveyed by a wireless form of the communications medium 905 (e.g., a wireless communications medium conforming with the IEEE 802.11 standard or other transmission protocol).

The one or more programming instructions 902 may be, for example, computer executable and/or logic implemented instructions. In some examples, a computing device such as the computing device 800 of FIG. 8 may be configured to provide various operations, functions, or actions in response to the programming instructions 902 conveyed to the computing device 800 by one or more of the computer readable medium 903, the computer recordable medium 904, and/or the communications medium 905.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A method, comprising:
receiving, by a computing device, an annotated template of a first three-dimensional (3D) object data model, the annotated template associated with a given category of objects, wherein the annotated template includes one or more annotations to one or more aspects of an object described by the first 3D object data model that indicate information associated with attributes of the one or more aspects of the object;
determining, by the computing device, one or more matching correspondences between the first 3D object data model and a second 3D object data model, wherein the second 3D object data model describes a given object in the given category, and wherein each of the one or more matching correspondences comprises an individual correspondence point of the first 3D object data model that corresponds to a respective correspondence point of the second 3D object data model; and
based on the one or more matching correspondences between the first 3D object data model and the second 3D object data model, mapping, by the computing device, an annotation of the one or more annotations that is associated with a correspondence point of the first 3D object data model to a matching correspondence point of the second 3D object data model,
wherein said mapping comprises mapping a custom call-out to the annotated correspondence point of the second 3D object data model, wherein the custom call-out comprises information to be associated with an aspect of the given object by way of an optional visual graphic when the second 3D object data model is provided for display within a 3D image viewer.

2. The method of claim 1, further comprising:
determining the custom call-out for the aspect of the given object based on a classification document for the given object.

3. The method of claim 1, wherein the custom call-out comprises an advertisement.

4. The method of claim 1, wherein the custom call-out comprises a custom identification of a given attribute of the aspect.

5. The method of claim 1, further comprising determining one or more matching correspondences between a surface of the first 3D object data model and a surface of the second 3D object data model based on geometric properties of the surface of the first 3D object data model and the surface of the second 3D object data model.

6. The method of claim 5, further comprising determining one or more matching correspondences between the surface of the first 3D object data model and the surface of the second 3D object data model based on material properties of the surface of the first 3D object data model and the surface of the second 3D object data model and the geometric properties.

7. The method of claim 5, wherein said geometric properties are selected from the group consisting of: three-dimensional position, curvature, surface normal, and mesh topology.

8. The method of claim 1, further comprising determining one or more matching correspondences between a volume associated with the first 3D object data model and a volume associated with the second 3D object data model, wherein the correspondence point of the first 3D object data model is a point on an interior of the object represented by first 3D object data model and the matching correspondence point of the second 3D object data model is a point on an interior of the given object represented by the second 3D object data model.

9. A non-transitory computer-readable medium having stored therein instructions, that when executed by a computing device, cause the computing device to perform functions comprising:
   receiving an annotated template of a first three-dimensional (3D) object data model, the annotated template associated with a given category of objects, wherein the annotated template includes one or more annotations to one or more aspects of an object described by the first 3D object data model that indicate information associated with attributes of the one or more aspects of the object;
   determining one or more matching correspondences between the first 3D object data model and a second 3D object data model, wherein the second 3D object data model describes a given object in the given category, and wherein each of the one or more matching correspondences comprises an individual correspondence point of the first 3D object data model that corresponds to a respective correspondence point of the second 3D object data model; and
   based on the one or more matching correspondences between the first 3D object data model and the second 3D object data model, mapping an annotation of the one or more annotations that is associated with a correspondence point of the first 3D object data model to a matching correspondence point of the second 3D object data model,
   wherein said mapping comprises mapping a custom call-out to the annotated correspondence point of the second 3D object data model, wherein the custom call-out comprises information to be associated with an aspect of the given object by way of an optional visual graphic when the second 3D object data model is provided for display within a 3D image viewer.

10. The non-transitory computer-readable medium of claim 9, wherein the functions further comprise:
   determining the custom call-out for the aspect of the given object based on a classification document for the given object.

11. The non-transitory computer-readable medium of claim 9, wherein the custom call-out comprises an advertisement.

12. The non-transitory computer-readable medium of claim 9, wherein the custom call-out comprises a custom identification of a given attribute of the aspect.

13. The non-transitory computer-readable medium of claim 9, wherein the functions further comprise determining one or more matching correspondences between a surface of the first 3D object data model and a surface of the second 3D object data model based on geometric properties of the surface of the first 3D object data model and the surface of the second 3D object data model.

14. The non-transitory computer-readable medium of claim 13, wherein the functions further comprise determining one or more matching correspondences between the surface of the first 3D object data model and the surface of the second 3D object data model based on material properties of the surface of the first 3D object data model and the surface of the second 3D object data model and the geometric properties.

15. The non-transitory computer-readable medium of claim 13, wherein said geometric properties are selected from the group consisting of: three-dimensional position, curvature, surface normal, and mesh topology.

16. The non-transitory computer-readable medium of claim 9, wherein the functions further comprise determining one or more matching correspondences between a volume associated with the first 3D object data model and a volume associated with the second 3D object data model, wherein the correspondence point of the first 3D object data model is a point on an interior of the object represented by the first 3D object data model and the matching correspondence point of the second 3D object data model is a point on an interior of the given object represented by the second 3D object data model.

17. A system, comprising:
   a processor;
   a database, the database comprising an annotated template of a first three-dimensional (3D) object data model, the annotated template associated with a given category of objects, wherein the annotated template includes one or more annotations to one or more aspects of an object described by the first 3D object data model that indicate information associated with attributes of the one or more aspects of the object;
   a matching component coupled to the database, the matching component configured to determine one or more matching correspondences between the first 3D object data model and a second 3D object data model, wherein the second 3D object data model describes a given object in the given category, and wherein each of the one or more matching correspondences comprises an individual correspondence point of the first 3D object data model that corresponds to a respective correspondence point of the second 3D object data model; and
   an annotation component coupled to the matching component, the annotation component configured to map an annotation of the one or more annotations that is associated with a correspondence point of the first 3D object data model to a matching correspondence point of the second 3D object data model based on the one or more matching correspondences between the first 3D object data model and the second 3D object data model,
   wherein said mapping comprises mapping a custom call-out to the annotated correspondence point of the second 3D object data model, wherein the custom call-out comprises information to be associated with an aspect of the given object by way of an optional visual graphic when the second 3D object data model is provided for display within a 3D image viewer.

18. The system of claim 17:
   wherein the annotation component is further configured to:
      determine the custom call-out for the aspect of the given object based on a classification document for the given object.

19. The system of claim 17, wherein the custom call-out comprises an advertisement.

20. The system of claim 17, wherein the custom call-out comprises a custom identification of a given attribute of the aspect.

21. The system of claim 17, wherein the matching component is further configured to determine one or more matching correspondences between a surface of the first 3D object data model and a surface of the second 3D object data model based on geometric properties of the surface of the first 3D object data model and the surface of the second 3D object data model.

22. The system of claim 21, wherein the matching component is further configured to determine one or more matching correspondences between the surface of the first 3D object data model and the surface of the second 3D object data model based on material properties of the surface of the first 3D object data model and the surface of the second 3D object data model and the geometric properties.

23. The system of claim 21, wherein said geometric properties are selected from the group consisting of: three-dimensional position, curvature, surface normal, and mesh topology.

24. The system of claim 17, wherein the matching component is further configured to determine one or more matching correspondences between a volume associated with the first 3D object data model and a volume associated with the second 3D object data model, wherein the correspondence point of the first 3D object data model is a point on an interior of the first 3D object data model and the matching correspondence point of the second 3D object data model is a point on the interior of the second 3D object data model.

* * * * *